under 35 U.S.C. 154(b) by 0 days.

(12) United States Patent
Meissl et al.

(10) Patent No.: US 9,778,578 B2
(45) Date of Patent: Oct. 3, 2017

(54) LOW CONTACT IMPRINT LITHOGRAPHY TEMPLATE CHUCK SYSTEM FOR IMPROVED OVERLAY CORRECTION

(71) Applicants: Canon Nanotechnologies, Inc., Austin, TX (US); Toshiba Corporation, Tokyo (JP)

(72) Inventors: Mario Johannes Meissl, Austin, TX (US); Anshuman Cherala, Austin, TX (US); Byung-Jin Choi, Austin, TX (US); Seth J. Barnesberger, Austin, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 0 days.

(21) Appl. No.: 14/536,069

(22) Filed: Nov. 7, 2014

(65) Prior Publication Data

US 2015/0131072 A1    May 14, 2015

Related U.S. Application Data

(60) Provisional application No. 61/901,549, filed on Nov. 8, 2013.

(51) Int. Cl.
*G03B 27/60* (2006.01)
*G03F 7/20* (2006.01)
*G03F 7/00* (2006.01)

(52) U.S. Cl.
CPC ........ *G03F 7/70708* (2013.01); *G03F 7/0002* (2013.01)

(58) Field of Classification Search
CPC ................... G03F 7/0002; G03F 7/70708
See application file for complete search history.

(56) References Cited

U.S. PATENT DOCUMENTS

| 6,873,087 | B1 | 3/2005 | Choi et al. |
| 6,932,934 | B2 | 8/2005 | Choi et al. |
| 6,936,194 | B2 | 8/2005 | Watts |
| 7,077,992 | B2 | 7/2006 | Sreenivasan et al. |
| 7,157,036 | B2 | 1/2007 | Choi et al. |
| 7,179,396 | B2 | 2/2007 | Sreenivasan |
| 7,396,475 | B2 | 7/2008 | Sreenivasan |
| 7,768,624 | B2 | 8/2010 | Cherala et al. |
| 8,076,386 | B2 | 12/2011 | Xu et al. |
| 8,349,241 | B2 | 1/2013 | Sreenivasan et al. |
| 2004/0065252 | A1 | 4/2004 | Sreenivasan et al. |
| 2004/0090611 | A1 | 5/2004 | Choi et al. |
| 2005/0087939 | A1* | 4/2005 | Caldwell ........ H01L 21/67288 279/128 |
| 2005/0266587 | A1 | 12/2005 | Nimmakayala et al. |
| 2008/0213418 | A1 | 9/2008 | Tan et al. |
| 2010/0072652 | A1 | 3/2010 | Ganapathisubramanian et al. |
| 2010/0320645 | A1 | 12/2010 | Ganapathisubramanian et al. |
| 2011/0001954 | A1* | 1/2011 | GanapathiSubramanian ................ B82Y 10/00 355/72 |
| 2013/0182236 | A1 | 7/2013 | De Schiffart et al. |

* cited by examiner

*Primary Examiner* — Deoram Persaud
(74) *Attorney, Agent, or Firm* — Cameron A. King

(57) ABSTRACT

Imprint lithography template chucks and related systems and methods are provided that substantially maintain structural support functions while significantly enhancing imprint quality functions. The chucks incorporate dynamic vacuum seals to substantially reduce template contact during alignment and distortion correction while still providing good structural support upon separation.

16 Claims, 4 Drawing Sheets

LOW CONTACT IMPRINT LITHOGRAPHY TEMPLATE CHUCK SYSTEM FOR IMPROVED OVERLAY CORRECTION

CROSS-REFERENCE TO RELATED APPLICATION

This application claims the benefit under 35 U.S.C. §119 (e)(1) of U.S. Provisional Application No. 61/901,549 filed Nov. 8, 2013; which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Imprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Imprint lithography is also useful in fabricating layers in a thin film head device for hard disks. Imprint lithography can also be used to fabricate patterned media for hard disk drives, optical devices such as polarizers for displays, photonic crystal structures, light trapping structures and filters for photovoltaic devices, nanostructures for battery electrodes, quantum dot structures for enhanced photonic and photovoltaic devices, biomedical devices, sensors, and in the fabrication of controlled nano-particles. Controlled nano-particles can be used to fabricate crystalline semiconducting materials, or as polymer-based drug carriers, among other uses. Exemplary imprint lithography processes are described in detail in numerous publications, such as U.S. Pat. No. 8,349,241, U.S. Patent Publication No. 2004/0065252, and U.S. Pat. No. 6,936,194, all of which are hereby incorporated by reference herein.

An imprint lithography technique disclosed in each of the aforementioned U.S. patent publication and patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
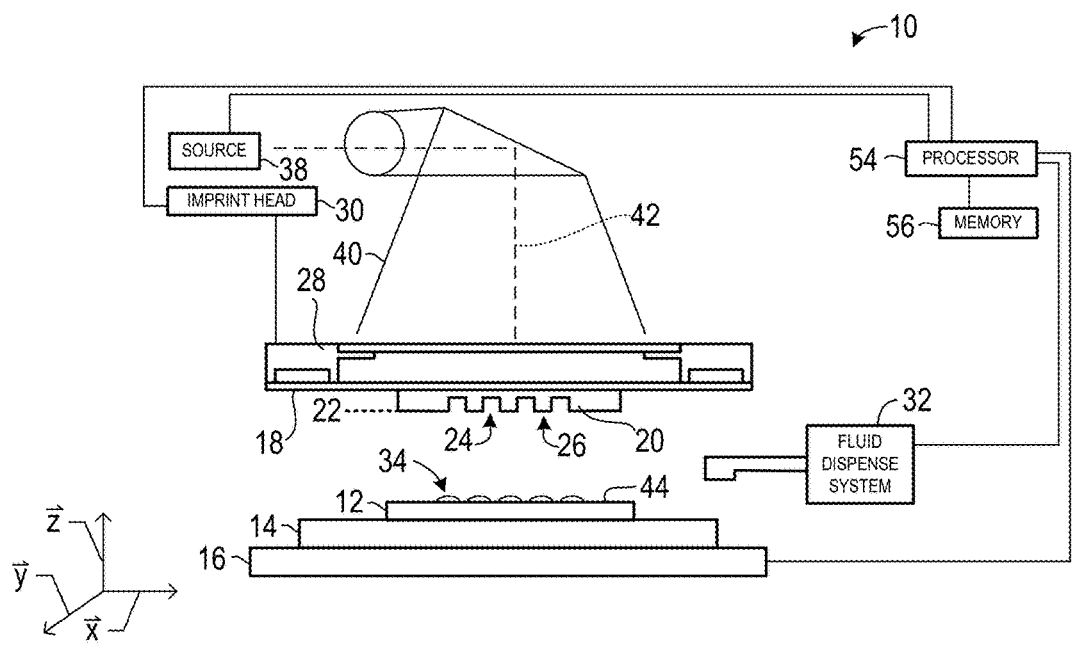
FIG. 1 illustrates a simplified side view of a lithographic system having a template and a mold spaced apart from a substrate.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Pat. No. 8,076,386, both of which are herein incorporated by reference. Alternatively, formable material 34 may include, but is not limited to, biomaterials (e.g., PEG), solar cell materials (e.g., N-type, P-type materials), and/or the like.

Figure 2:
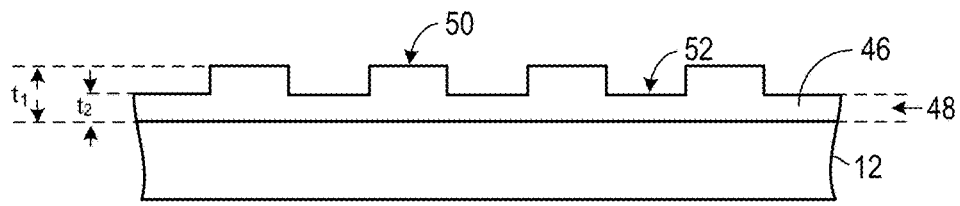
FIG. 2 illustrates a simplified view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, each of which is hereby incorporated by reference in its entirety.

The most effective imprint lithography template chucks provide for two categories of functional requirements: structural support functions, and pattern quality functions. Structural support functions are necessary to hold the template in place, and prevent its deformation, under loads encountered during the imprint and separation processes. Structural support features are therefore features that, for example: (i) support imprint loading, including template back pressure to modulate template shape during filling, (ii) support in-plane and in-liquid alignment loading, and/or (iii) support separation loading. Imprint quality functions are necessary to ensure controlled filling, uniform residual layer, and precise overlay control. Imprint quality features are therefore features that, for example: (i) retain the template with minimum contact to avoid trapping particles between template and chuck, (ii) maintain or induce ideal flatness or planarity to the active area surface (i.e., patterning surface) of the template, and/or (iii) permit controlled in-plane shape change of template for overlay, such as magnification control.

Figure 3A:
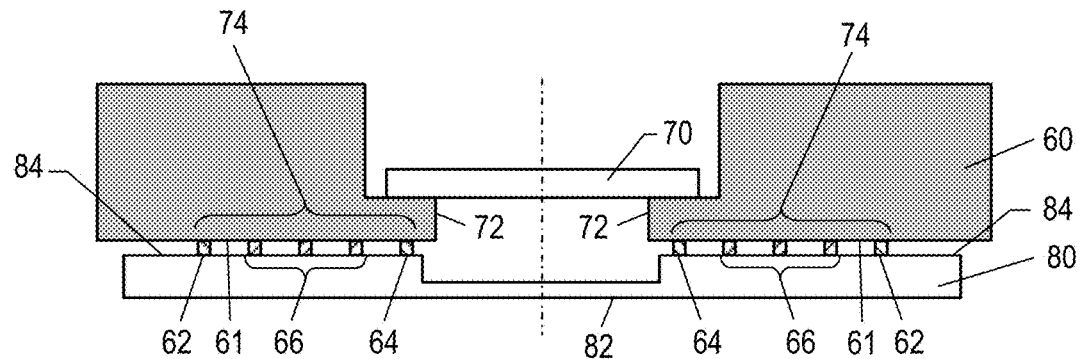
FIG. 3A illustrates a simplified side cross-sectional view of a chucking system and retained template according to a prior art embodiment.
Figure 3B:
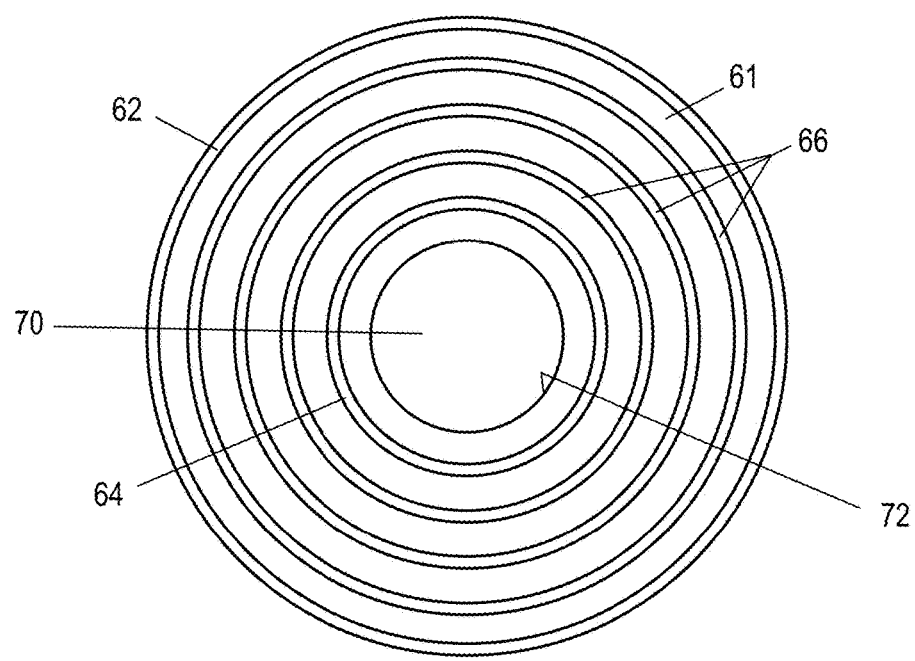
FIG. 3B illustrates a bottom view of the chucking system of FIG. 3A.

Conventional imprint lithography template chucks are typically relatively stiff and usually contain a combination of lands and/or pins that are in physical contact with the template back surface. Vacuum pressure may be used to retain the template against the lands and/or pins. Contact between the template and continuous land seals creates a vacuum zone and may be used to maintain a static vacuum force. Additional pin or land supports may be added within a vacuum zone to avoid having the template deform significantly under the applied vacuum pressure and further to resist deformation from external forces, including external forces associated with imprinting and separation processes. An example of such a template chuck is shown in FIGS. 3A-3B. Template chuck 60 is shown in superimposition with retained template 80. Chuck 60 includes inner rim 72 that supports transparent window 70, with window 70 in superimposition with active area 82 of template thereby allowing for transmission of energy to polymerizable material when in contact with the active area. Chuck 60 further includes annular lands 62 and 64 extending from chuck surface 61 and in contact with back surface 84 of template 80. These lands 62 and 64 define a recess or vacuum zone 74 between the chuck and template, extending between the lands. Application of vacuum pressure, typically through channels (not shown) provided in the chuck body that open to chuck surface 61, creates a vacuum force within vacuum zone 74 that retains template 80 against chuck 60. In addition to lands 62 and 64, lands 66 positioned within vacuum zone 74 are also in contact with back surface 82 to prevent significant deformation of the template that may be caused due to the applied vacuum pressure and/or due to external deflective forces.

Chuck 60 and similar chucks have proven effective at providing necessary structural support functions, but they have not been as effective in providing imprint quality functions. First, continuous vacuum sealing lands of such template chucks are typically stiff in the out-of-plane direction, necessitating a significant support area of pins and/or lands within the vacuum zone in order to keep the template from bending concavely between the sealing lands. This, in turn, increases the required contact area between the chuck and template in the form of such additional pins and/or lands. An increased contact area, in turn, increases the chances of localized trapping of particles between the template and the chuck contact points. This, in turn, can lead to undesirable localized template deformation in the area of the particle trapping. Second, in order to reduce template manufacturing costs, template back (or backside) surfaces are often not as precisely machined as the front (or frontside) active area surface (i.e., patterning surface) of the template. As a result, such backside surfaces are typically not as uniformly planar or flat as the front surface. Further, the relative flatness of the template back surfaces can vary from template to template. That is, there can be localized and/or regional variation in backside surface planarity or flatness between manufactured templates. As a result of such variances, a given template backside surface very often does not precisely match template chuck contact surfaces, which are typically designed with the expectation of template backsides having uniform planarity or flatness. When a given template is thus restrained against such a template chuck via application of vacuum, the distributed, large vacuum area of the template chuck essentially flattens the template backside surface through vacuum forces as it brings the template backside into surface contact with the template chuck. As a result, as the backside surface of the template is brought into a flatter, more planar configuration, the previously flat active area surface becomes distorted in response, which can lead to imprinting error. Third, the land and/or pin support area of a typical template chuck is not only stiff in the out-of-plane direction, but also in the in-plane direction, which has an impact on effective distortion correction of a retained template. Distortion correction can include applying controlled forces to the template perimeter to correct for overlay errors such as magnification, skew/orthogonality, and trapezoidal errors, as is described in U.S. Pat. No. 7,768,624, incorporated herein by reference in its entirety. Any template shape change for distortion correction therefore requires a small amount of relative movement between the template and individual land or pin supporting areas of the chuck. Since these lands and pins are in contact with the template, frictional forces arise which oppose or resist such movement. These frictional forces limit and/or reduce the available range of magnification and/or other distortion control and can cause hysteresis that limits the magnification and/or other distortion control resolution.

The invention described herein provides template chucks and related systems and methods that substantially maintain the structural support functions of conventional template chucks, while significantly enhancing the imprint quality functions. Template chucks according to the present invention may have one or more of the following features: (1) the template contact area may be substantially reduced during alignment and imprinting, causing the template to better retain its original out-of-plane shape with a flat active area; (2) the contact with the template is stiff enough in the out-of-plane direction to provide for adequate support of the template; and (3) the compliance of the contact regions between the template and the chuck is both stiff enough to support in-liquid alignment forces, keeping the template substantially centered on the chuck, yet soft enough to permit the template and chuck contact regions to remain in static friction contact while the template changes in-plane shape for alignment and distortion correction.

As is further described herein, a template chuck having the above features is achieved through the provision of a dynamic vacuum seal or seals and a controlled gap between the vacuum seal (or seals) that is controlled by the provision of one or more pins. As used herein, the term "seal" refers to a raised structure extending from the chuck surface analogous to a land but not designed to actually contact the template. Rather, the provided pins are adapted to extend further from chuck surface than the seal(s) so as to maintain a controllable gap between the seal(s) and the template. This gap can be achieved through e.g. precision machining in combination with deposition or etching to obtain a static step or height difference between the seal and pins. Alternatively, the pins (and/or seals) can be actuated by piezo stacks so that the gap can be selectively controlled. The gap or distance d can be in the range of 0.05 microns to 5.0 microns.

Figure 4A:
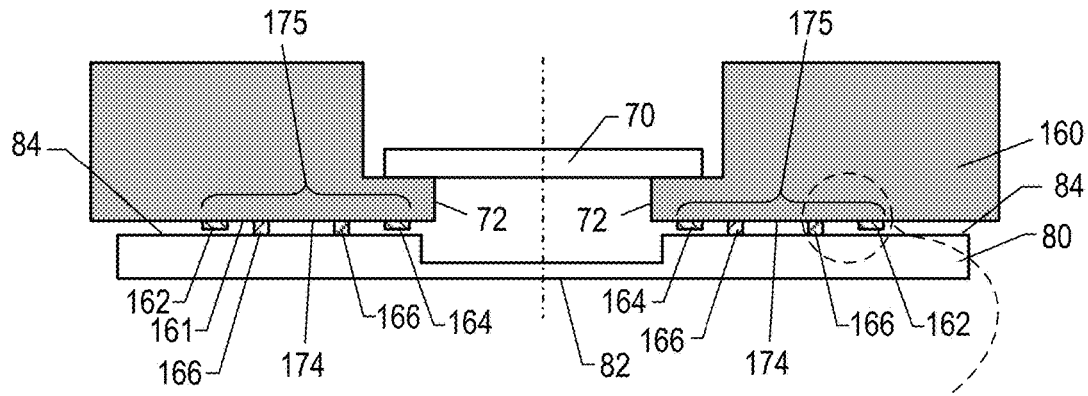
FIGS. 4A and 4B illustrate a simplified side cross-sectional view of a chucking system and retained template according to one embodiment of the invention.
Figure 4B:
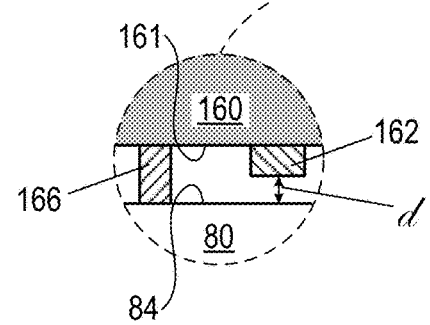

Referring to FIGS. 4A and 4B, in one embodiment, a chucking system is provided having chuck body 160 with template support surface 161 disposed in superimposition with retained template 80. Surface 161 had first and second dynamic vacuum seals 162 and 164 extending therefrom. Seals 162 and 164 are annular and concentric, with seal 162 surrounding seal 164 and defining recess 174 between seals 162 and 164. This recess 174 in conjunction with the backside 84 of template 80 forms a sealing area or chucking zone 175. Additional support pins 166 extend from surface 161 within recess 174. Support pins 166 are in contact with backside 84 of retained template 80 and maintain template 80 at a predetermined gap or distance d from first and second seals 162 and 164. One or more fluid channels (not shown) extend through chuck body 160 and open to recess 174. A pressure control system (not shown) is further provided and operatively coupled to the fluid channels. The pressure control system is configured to apply and maintain a controlled vacuum pressure to recess 174 via the fluid channels. Typical applied vacuum pressures can range from −30 kPa to −80 kPa.

The sealing area or chucking zone 175 is wide enough (i.e., distance between seals 162 and 164 is wide enough), and the gap or distance d between seals 162 and 164 and backside 84 of template 80 is small enough that the seals 162 and 164 effectively create dynamic pressure seals that maintain the template chucking force. That is, the sealing areas are wide enough, and the gap or distance d is small enough, to maintain vacuum pressure within the enclosed sealing area by creating sufficient flow resistance in the gap with a given air (or other gas) flow rate through the gap. As previously noted, the gap or distance (d) can be in the range of 0.05 microns to 5.0 microns. In this fashion, sufficient chucking force (e.g. −30 kPa to −80 kPa) is maintained throughout chucking zone 175 to retain template 80 against the chuck without seals 162 and 164 actually contacting the template. Gap distance larger than 5.0 microns can allow for vacuum leakage, and thus disrupt proper retention of the template against the chuck. On the other hand, gap distances less than 0.05 microns can lead to localized template contact with the seals, and thus higher overlay correction.

The number, size, and locations of support pins are selected such that desirable compliance with contact regions on the template is achieved. Such compliance permits the template to change in-plane shape, as necessary, to achieve required overlay alignment while also maintaining static friction contact with the chuck. The advantage of using only pins (i.e., protrusions that have a circular or quadratic cross section) is that pins have similar or equal compliance in all lateral directions. In this fashion the contact region compliance is simultaneously optimized for distortion correction in both lateral axes (e.g., x and y axes). On the other hand, if land structures (i.e., structures that are narrow in one direction and elongated in the other) were present, the compliance would only be optimized along at most one axis.

Pin locations are chosen such that the pins support the vacuum chucking load in a manner that does not deform active area 82 of template 80. Note that due to the absence of sealing lands in contact with the chuck, which tend to cause concave distortion of the template in the vacuum area, fewer pins are necessary to prevent such active area deformation. The pins also support against excessive out-of-plane template deformation from imprint, separation, and distortion correction (e.g. magnification control) forces, since such deformation can give rise to undesirable in-plane deformation of the active area. The pins also attenuate the dynamic sealing gap variations that result from vacuum loading and other loads acting on the template, since such sealing gap variations affect the required flow rate to maintain a constant chucking pressure. An example of selected pin locations that achieve the above is provided in FIG. 5B as further described herein Referring to FIGS. 5A and 5B, in an additional embodiment, chuck body 160a further includes a third, inner dynamic vacuum seal 168, likewise annular and concentric, and that creates an additional balancing pressure zone 177 defined by the recess 176 formed between seals 164 and 168. Balancing pressure zone 177 is provided to counteract potential undesirable effects that may arise when using back pressure against template 80 with chuck 160. Back pressure is commonly used to modulate the shape of imprint lithography templates during imprint fluid filling. The applied back pressure can sometimes cause an undesirable bending moment in the chucking zone and can also reduce the chucking force applied to the template. These effects can in turn shift the load carried between supporting pins, and reduce the overall load on the supporting pins. However, a certain minimum load must be maintained on each pin to ensure static friction contact without slipping. Additionally, the dynamic seal gap d can increase when back pressure is activated (causing increased gas or air flow). If the back pressure and chucking zones are sharing a common seal gap, the flow across this seal will further increase as back pressure is applied, which if it becomes too high may disrupt the applied chucking force.

Figure 5A:
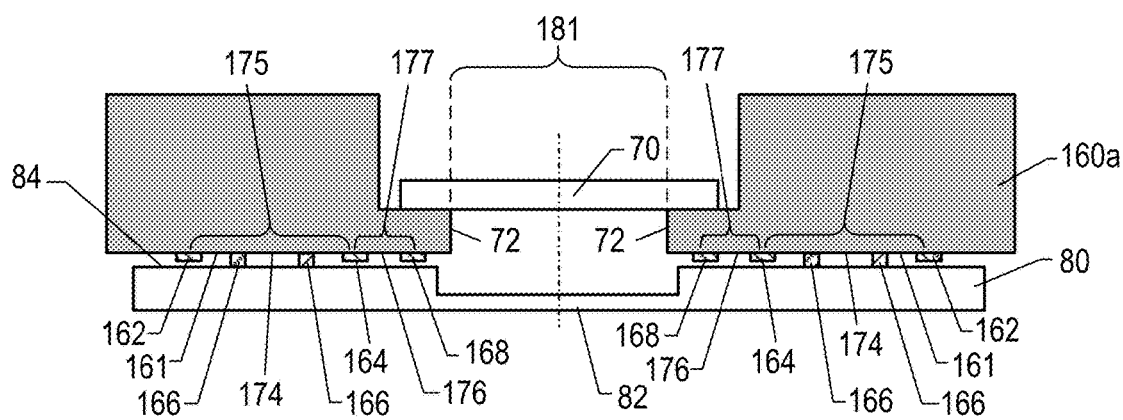
FIG. 5A illustrates a simplified side cross-sectional view of a chucking system and retained template according to another embodiment of the invention.
Figure 5B:
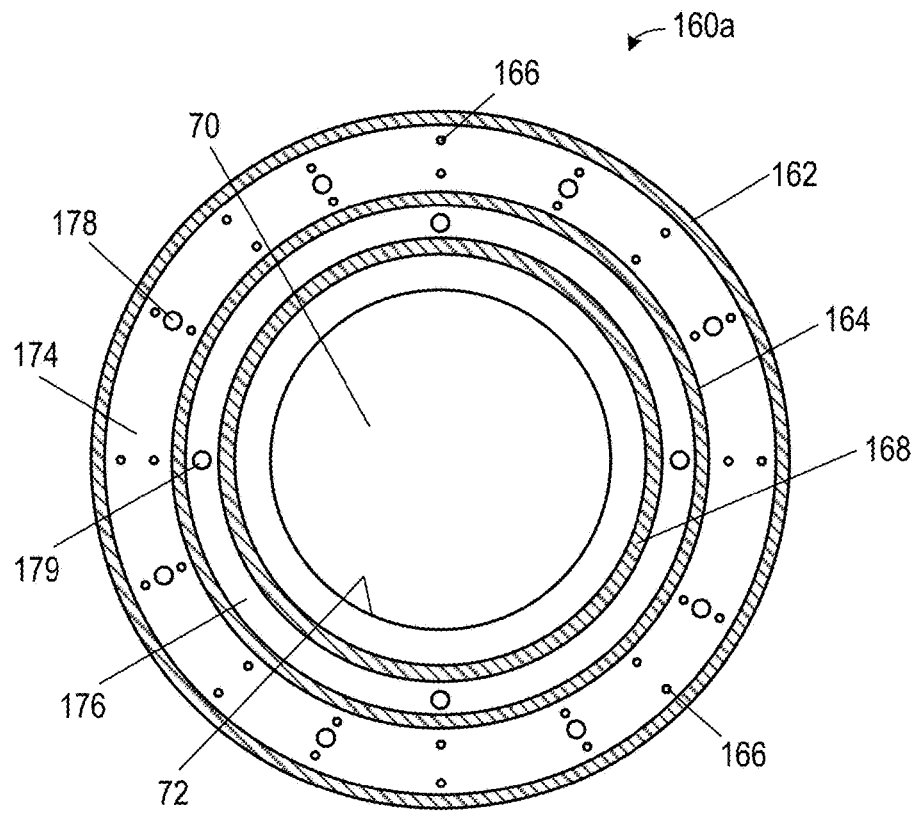
FIG. 5B illustrates a bottom view of the chucking system of FIG. 5A.

To counteract the above, balancing pressure zone 177 is provided and consists of a vacuum zone located between the holding or chucking vacuum zone 175 and the back pressure zone 181 (i.e., the backside area coinciding with the active area of the template). That is, the balancing pressure zone 177 is defined by recess 176 formed between dynamic vacuum seal 164 and additional dynamic vacuum seal 168. As depicted in FIGS. 5A and 5B, seal 168 is spaced apart from seal 164 with seal 164 surrounding seal 168. Unlike chucking zone 175, balancing pressure zone 177 contains no support regions; vacuum pressure is contained with dynamic pressure seal gaps created by dynamic seal 164 and additional dynamic seal 168. This balancing pressure zone 177 increases the chucking force, specifically on the innermost of pins 166 which experience the greatest reduction in load from activation of back pressure to the retained template 80 which can typically be up to 30 kPa. The balancing vacuum pressure is regulated to proportionally match the back pressure at all times. When back pressure is zero, the balancing vacuum pressure is also zero, and when back pressure is applied, balancing vacuum pressure is likewise applied proportionally. In this manner, the minimum load on all support pins 166 can be held substantially constant over the imprint cycle (i.e., during filling, curing, and separation). In addition, the dynamic seal gaps d do not vary as much when the balancing vacuum pressure is applied along with back pressure. The balancing pressure zone 177 further acts as a barrier zone between holding vacuum zone 175 and back pressure zone 181 so that the flow across the dynamic seal gaps d is substantially unaffected when back pressure is activated.

The balancing pressure zone 177 can also be used during separation. This way, the effects of separation force on support pin 166 loads are attenuated. As positive or negative gauge pressure is acting in the back pressure zone to assist in separation; the balancing pressure applied in balancing pressure zone 177 is adjusted in real-time (based on separation force feedback) to counteract the separation force and back pressure zone effects.

To enhance static friction contact between pins 166 and template 80, chuck 160 or 160a and template 80, various material combinations, as well as coatings on chuck 160 or 160a or template 80, may be used that enhance the dry static friction coefficient. An exemplary material for template 80 is fused silica. Exemplary chuck 160 or 160a materials include silicon carbide, stainless steel, anodized aluminum, and alumina. Pins 166 may also be formed from or coated with a polymer that increases lateral compliance or increases friction.

Referring to FIG. 5B, chuck 160a includes a particular layout of pins 166 within chucking zone 175, which again is defined by recess 174 between seals 162 and 164. Thirty-two pins 166 are provided in radially disposed pairs and approximately equidistantly spaced, with alternating pairs bracketing pressure supply channels 178. A lesser or greater number of pins or pin pairs can likewise be utilized. Pin diameters can range from 0.3 mm to 0.8 mm and pin heights can range from 0.2 mm to 1.5 mm. Again, balancing zone 177 defined by recess 176 between seal 164 and added inner seal 168 is devoid of pins, but does include pressure supply channels 179 radially spaced about the zone. Since static friction contact is maintained between template 80 and chuck 160a, the shape change of the template for magnification is almost purely elastic. Therefore, a chucking system incorporating chuck 160a does not limit the magnification correction resolution and does not suffer from hysteresis.

Figure 6:
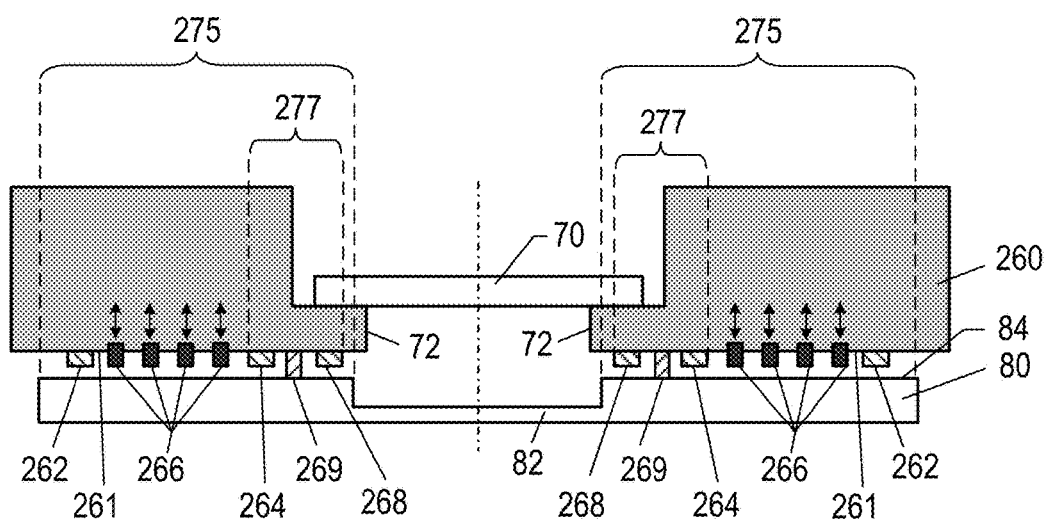
FIG. 6 illustrates a simplified side cross-sectional view of a chucking system and retained template according to yet another embodiment of the invention.

Turning to FIG. 6, in a further embodiment chuck 260 is provided with radially disposed dynamic seals 262, 264 and 268 extending from template support surface 261 that provide for variable chucking zones and a variable support area. Full chucking zone 275 extends from outermost seal 262 to innermost seal 268 and is used to its full extent during separation—with separation force typically being the dominant force in an imprint lithography process. The use of full chucking zone 275 during separation provides for a very rigid support area that is distributed over most of the back surface 84 of template 80. The chucking vacuum force is also supported with retractable pins 266, as well as fixed pins 269 distributed over full chucking zone 274 to prevent template 80 from distorting due to this force. As further detailed, the retractable pins 266 are extended into contact with back surface 84 of the template during separation. Alternatively, retractable lands can likewise be used.

During imprinting and alignment, a substantial part of full chucking zone 275 is turned off, i.e., retractable pins 266 in the inactive portion of chucking zone 275 are physically retracted so they are no longer in contact with back surface 84 of template 80, as is depicted in FIG. 6. This retraction stroke only needs to be on the order of a few microns, and can be achieved e.g. with piezo actuators. Remaining chucking zone 277, which extends from middle seal 264 to innermost seal 268, remains active and under chucking vacuum force, and further includes fixed support pins 269. These support pins may, for example, comprise only three points of contact (or three isolated regions of contact), which is the minimum necessary to stably hold the template. Such a three-point contact enables template 80 to substantially regain its original shape (i.e., the shape with no forces acting on the template) so that active area 82 remains flat, even if template back surface 84 is not flat. Furthermore, the overall in-plane compliance of all support pins 269 that are still in contact is greatly reduced, enabling overlay distortion correction while pins 269 maintain static friction contact. Here, in order to maintain static friction, the remaining chucking force (i.e., the vacuum force applied in remaining chucking zone 277) needs to be large enough so that pins 269 that remain in contact still have a minimum normal force acting on them. For example, the applied chucking force may be reduced in proportion to the pins 266 that are retracted, causing remaining pins 269 to still have the same normal force.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A chucking system for holding an imprint lithography template comprising:
    a chuck body having a template support surface, the template support surface having:
        i) a first seal extending from a perimeter of the template support surface,
        ii) a second seal extending from the template support surface, with the first seal surrounding the second seal, a first recess defined between the first seal and the second seal, and
        iii) a third seal extending from the template support surface, with the first seal and the second seal surrounding the third seal, a second recess defined between the second seal and the third seal;
    a plurality of support pins located within the first recess and extending from the template support surface, the support pins adapted to contact the template and maintain the template at a distance d from the first, second, and third seals, and wherein the distance d is such that a vacuum seal can be maintained against the template when a vacuum pressure is applied to the recess, wherein the second recess does not include any support pins; and
    one or more fluid channels extending through the chuck body and opening to the first and the second recess; and
    a pressure control system operatively coupled to the one or more fluid channels configured to i) apply a vacuum pressure to the first recess to retain the template against the template support surface and configured to ii) apply a vacuum pressure to the second recess to proportionally match back pressure applied to the template such that a minimum load on the support pins is substantially constant.

2. The chucking system of claim 1 wherein the distance d is from 0.05 to 5.0 microns.

3. The chucking system of claim 1 wherein the first and second seals are annular and concentric.

4. The chucking system of claim 3 wherein the plurality of support pins is radially disposed relative to a center of the support chuck.

5. The chucking system of claim 3 wherein the plurality of support pins is provided as radially disposed pairs that are equidistantly spaced and wherein at least one of the pairs brackets at least one of the one or more fluid channels.

6. The chucking system of claim 1 wherein the third seal is annular and concentric with the first and second seals.

7. The chucking system of claim 1 further comprising one or more retractable pins located within the first recess and moveable from a first retracted position to a second extended position, the retractable pins adapted to contact the template when in the second extended position.

8. A chucking system for holding an imprint lithography template, the chucking system comprising:
    a chuck body having a template support surface, the template support surface having:
        first, second, and third seals extending from the template support surface, with the first seal surrounding the second seal, defining a first recess therebetween, and with the second seal surrounding the third seal, defining a second recess therebetween;
    a plurality of support pins located within the first recess and extending from the template support surface, the support pins adapted to contact the template and maintain the template at a distance d from the first and second seals, and wherein the distance d is such that a vacuum seal can be maintained against the template when a vacuum pressure is applied to the recess, wherein the second recess does not include any support pins; and
    one or more first fluid channels extending through the chuck body and opening to the first recess and one or more second fluid channels extending through the chuck body and opening to the second recess; and
    a pressure control system operatively coupled to the one or more first fluid channels and the one or more second fluid channels and configured to i) apply a vacuum pressure to the first recess to retain the template against the template support surface and configured to ii) apply a vacuum pressure to the second recess to proportionally match back pressure applied to the template such that a minimum load on the support pins is substantially constant.

9. The chucking system of claim 8 wherein distance d is from 0.05 to 5.0 microns.

10. The chucking system of claim 8 wherein the first, second, and third seals are annular and concentric.

11. The chucking system of claim 10 wherein the plurality of support pins is radially disposed relative to a center of the support chuck.

12. The chucking system of claim 10 wherein the plurality of support pins is provided as radially disposed pairs that are equidistantly spaced and wherein at least one of the pairs brackets at least one of the one or more fluid channels.

13. The chucking system of claim 8 further comprising one or more retractable pins located within the first recess and moveable from a first retracted position to a second extended position, the retractable pins adapted to contact the template when in the second extended position.

14. An imprint lithography method comprising:
    providing the chucking system of claim 8;
    positioning an imprint lithography template in proximity with the chucking system with the vacuum pressure applied through the one or more first and second channels to retain the template against the template support surface.

15. The method of claim 14 further comprising the steps of:
    contacting the template with polymerizable material disposed on a substrate;
    polymerizing the polymerizable material to form a patterned layer on the substrate having a relief pattern conforming to a patterning surface of the template; and
    separating the template from the formed patterned layer on the substrate.

16. The method of claim 15 wherein the applied back pressure is varied during the contacting, polymerizing and separating steps, and the increased vacuum pressure to the second recess is likewise varied such that it proportionally matches the varied applied back pressure during the contacting, polymerizing and separating steps.

\* \* \* \* \*